(12) United States Patent
Youngbull et al.

(10) Patent No.: US 9,525,097 B2
(45) Date of Patent: Dec. 20, 2016

(54) PHOTOVOLTAIC MODULE HAVING PRINTED PV CELLS CONNECTED IN SERIES BY PRINTED CONDUCTORS

(71) Applicant: Nthdegree Technologies Worldwide Inc., Tempe, AZ (US)

(72) Inventors: Tricia Youngbull, Tempe, AZ (US); Bradley Steven Oraw, Chandler, AZ (US); William Johnstone Ray, Fountain Hills, AZ (US)

(73) Assignee: Nthdegree Technologies Worldwide Inc., Tempe, AZ (US)

(*) Notice: Subject to any disclaimer, the term of this patent is extended or adjusted under 35 U.S.C. 154(b) by 329 days.

(21) Appl. No.: 14/214,559

(22) Filed: Mar. 14, 2014

(65) Prior Publication Data
US 2014/0261674 A1    Sep. 18, 2014

Related U.S. Application Data

(60) Provisional application No. 61/790,507, filed on Mar. 15, 2013.

(51) Int. Cl.
*H01L 27/142* (2014.01)
*H01L 31/0352* (2006.01)
(Continued)

(52) U.S. Cl.
CPC ......... *H01L 31/18* (2013.01); *H01L 31/03529* (2013.01); *H01L 31/035281* (2013.01);
(Continued)

(58) Field of Classification Search
CPC ............... H01L 31/046; H01L 31/0463; H01L 31/0465; H01L 31/035281; H01L 31/03529; H01L 31/18; Y02E 10/50
(Continued)

(56) References Cited

U.S. PATENT DOCUMENTS 3,925,770 A * 12/1975 Beacham ................ G06F 3/011
  250/215
4,126,812 A * 11/1978 Wakefield ................ G09F 9/33
  257/88
(Continued)

FOREIGN PATENT DOCUMENTS

| JP | 2001-308357 | * 11/2001 | ............ H01L 31/04 |
| JP | 2011165790 A | 8/2011 | |
| WO | WO 2013/096336 | * 6/2013 | ............... H02N 6/00 |

OTHER PUBLICATIONS

International Preliminary Search Report on Patentability for WO 2014/145221, Sep. 15, 2015.*

(Continued)

*Primary Examiner* — Mary Wilczewski
(74) *Attorney, Agent, or Firm* — Patent Law Group LLP; Brian D. Ogonowsky

(57) ABSTRACT

A PV module is formed having an array of PV cells, where the cells are separated by gaps. Each cell contains an array of small silicon sphere diodes (10-300 microns in diameter) connected in parallel. The diodes and conductor layers may be patterned by printing. A continuous metal substrate supports the diodes and conductor layers in all the cells. A dielectric substrate is laminated to the metal substrate. Trenches are then formed by laser ablation around the cells to sever the metal substrate to form electrically isolated PV cells. A metallization step is then performed to connect the cells in series to increase the voltage output of the PV module. An electrically isolated bypass diode for each cell is also formed by the trenching step. The metallization step connects the bypass diode and its associated cell in a reverse-parallel relationship.

14 Claims, 5 Drawing Sheets

(51) Int. Cl.
  *H01L 31/18* (2006.01)
  *H01L 31/0465* (2014.01)
  *H01L 31/0463* (2014.01)
  *H01L 31/046* (2014.01)

(52) U.S. Cl.
  CPC ........ *H01L 31/046* (2014.12); *H01L 31/0463* (2014.12); *H01L 31/0465* (2014.12); *Y02E 10/50* (2013.01)

(58) Field of Classification Search
  USPC .................................................. 136/250, 256
  See application file for complete search history.

(56) References Cited

U.S. PATENT DOCUMENTS

| | | | |
|---|---|---|---|
| 6,204,545 B1* | 3/2001 | Nakata | H01L 31/035281 136/250 |
| 6,294,822 B1* | 9/2001 | Nakata | H01L 31/02167 257/113 |
| 7,402,747 B2* | 7/2008 | Sugawara | H01L 31/035281 136/243 |
| 7,812,247 B2 | 10/2010 | Armstrong et al. | |
| 8,395,568 B2* | 3/2013 | Ray | B82Y 20/00 257/80 |
| 9,035,174 B2* | 5/2015 | Youngbull | H01L 31/02327 136/257 |
| 9,236,528 B2* | 1/2016 | Ray | B82Y 20/00 |
| 2003/0029494 A1* | 2/2003 | Ohkubo | H01L 31/0508 136/255 |
| 2003/0129813 A1* | 7/2003 | Lu | H01L 31/022408 438/571 |
| 2005/0127379 A1* | 6/2005 | Nakata | B32B 17/10036 257/84 |
| 2006/0043390 A1* | 3/2006 | Nakata | H01L 31/035281 257/82 |
| 2006/0086384 A1* | 4/2006 | Nakata | H01L 25/0753 136/250 |
| 2010/0047955 A1 | 2/2010 | Vijh | |
| 2010/0065862 A1* | 3/2010 | Ray | B82Y 20/00 257/88 |
| 2010/0167441 A1* | 7/2010 | Ray | G09G 3/32 438/29 |
| 2010/0219423 A1* | 9/2010 | Nakata | H01L 31/02008 257/88 |
| 2011/0114157 A1 | 5/2011 | Meissner | |
| 2013/0153027 A1* | 6/2013 | Youngbull | H01L 31/02327 136/257 |
| 2014/0261674 A1* | 9/2014 | Youngbull | H01L 31/18 136/256 |
| 2015/0207020 A1* | 7/2015 | Youngbull | H01L 31/02327 438/62 |

OTHER PUBLICATIONS

International Search Report for WO 2014/145221, Aug. 13, 2014.*
Written Opinion of the International Searching Authority for WO 2014/145122.*
PCT/US2014/029944, "International Search Report and Written Opinion", 13 pages.
Schmit R. et al., "Recent Progress in the Design and Fabrication of Spheral Solar Modules", Proceedings of the Photovoltaic Specialists Conference, Louisville, May 10-14, 1993, vol. conf. 23, May 10, 1993, pp. 1078-1081.

* cited by examiner

PHOTOVOLTAIC MODULE HAVING PRINTED PV CELLS CONNECTED IN SERIES BY PRINTED CONDUCTORS

CROSS-REFERENCE TO RELATED APPLICATIONS

This application claims priority from U.S. provisional application Ser. No. 61/790,507, filed Mar. 15, 2013, entitled All-Printed Photovoltaic Modules, by Tricia Youngbull et al., assigned to the present assignee and incorporated herein by reference.

FIELD OF THE INVENTION

This invention relates to forming photovoltaic (PV) panels, also known as solar panels or solar cells, and, in particular, to a technique for printing a PV panel having PV cells connected together in series.

BACKGROUND

US patent application publication no. US2010/0167441, entitled, Method of Manufacturing a Light Emitting, Photovoltaic or Other Electronic Apparatus and System, is assigned to the present assignee and incorporated herein by reference. The publication describes various techniques to form light emitting diode (LED) sheets and photovoltaic (PV) panels using arrays of semiconductor micro-diodes. In particular, the PV panels are comprised of microspheres and may be on the order of 20-40 microns in diameter. Several methods of manufacturing silicon spheres are known and include forming spheres from molten silicon in a drop tower, patterning silicon particle agglomerates on a substrate and melting them to form spheres by surface tension, or dropping powder through a plasma reactor.

In the prior art, a relatively large PV cell can be fabricated with all the micro-diodes connected in parallel. The voltage generated by each PV cell is about 0.6 volts, and the current depends on the size of the cell. Multiple PV cells can be separately manufactured and then the individual PV cells can be mounted on a much larger common substrate, such as having an area of several square feet to form a module. Tabbing and stringing to the cells is done to connect the individual PV cells in series to increase the voltage of the module. This process is slow and expensive, and the solder joints used to connect to each cell are susceptible to failure, resulting in power loss during the operating lifetime of the panel. Integration of bypass diodes is also done at the module level in a serial process, and typically, several cells rely on a single bypass diode to save on cost. Moreover, this technique of increasing the voltage is limited since there is a linearly increasing cost to separately mount more and more PV panels on a large substrate and connect them in series.

What is needed is an inexpensive technique to form a single PV module, of any size, using printed silicon micro-diodes, where the single PV module is made up of many small PV cells connected in series with printed bypass diodes connected in parallel. This also enables higher voltages, such as exceeding 200 volts, to be generated by a single PV panel. This ultimately lowers the total balance of system cost of a photovoltaic array.

SUMMARY

In one embodiment, an all-atmospheric pressure process is used to form a PV panel. An efficient roll-to-roll fabrication technique may be used.

In one embodiment, a flexible dielectric substrate, such as polycarbonate, PET, or other polymer is used as the starting substrate. In another embodiment, the starting substrate is a thin metal foil, and the foil is laminated onto the dielectric substrate prior to cell isolation.

A layer of aluminum-containing ink is printed over the substrate, followed by printing a silicon sphere slurry on the uncured aluminum-containing ink. It is assumed that the starting substrate is a metal foil, such as an aluminum foil. The aluminum-containing ink is patterned during printing, such as by slot die coating, a screen mask, or by flexography, to define an array of individual PV cells.

A slurry of silicon spheres is prepared as an ink. The silicon spheres may be 10-300 microns in diameter and are pre-doped to be n-type or p-type, or have an intrinsic conductivity type. Lightly doped p-type microspheres are assumed in the example. The slurry is then printed in the same pattern that the aluminum-containing ink was patterned. The printed slurry creates a closed-packed monolayer of silicon spheres, and the spheres become embedded in the aluminum-containing ink. The aluminum-containing ink is then cured (e.g., ink's solvent evaporated) and annealed (aluminum particles sintered) by an in-line furnace or other heat source. The annealing causes the contact area of the silicon spheres to alloy with the aluminum ink to form a back surface field, or highly doped $p^+$ silicon, and form an ohmic contact with the aluminum. This $p^+$ layer reduces electron-hole recombination at the sphere's back surface and thus increases efficiency by a total of 1-3 percentage points.

A dielectric is printed over the spheres. The dielectric is designed to wet off (or wick off) the top of the microspheres by capillary action and surface tension to form a 1-15 micron thick coating between the microspheres, and then cured. A residual layer of dielectric approximately 150 nm or less remaining on the tops of the silicon spheres is not detrimental to forming the pn junction.

Phosphoric acid, phosphorus-doped glass, phosphorus-doped silicon nanoparticles, or a phosphorus-containing silicon precursor is printed over the spheres and heated, such as by a laser, to diffuse the n-type dopants into the top surface of the spheres, forming diodes. Residual phosphorus dopant is then washed from the tops of the spheres.

A transparent conductor, such as a conductive ink, is then slot die coated (or printed by other means) over the exposed n-type layer of the spheres. If the conductor material is deposited as a liquid, the conductor viscosity may be sufficiently low that it pools around the lower portion of the spheres by gravity, surface tension, and capillary action, and retracts from over the spheres to form a conducting network. Such pooling reduces the resistance of the conductor and avoids issues with the conductor covering the diode and reducing optical transmission.

Therefore, the continuous bottom aluminum foil substrate electrically contacts the anode side of the micro-diodes, and the patterned transparent conductor electrically contacts the cathode side of the micro-diodes. All the micro-diodes in each of the PV cells are connected in parallel. The overall PV module may be several feet wide and several feet in length.

A dielectric substrate is then laminated to the back surface of the aluminum foil substrate.

The following technique is used to electrically isolate PV cells within a single module to allow the cells to be connected in series.

A laser is controlled to ablate the aluminum foil substrate between the printed PV cells (i.e., within the gaps where the spheres are not printed), down to the dielectric laminated substrate, to form narrow trenches around each cell area to electrically isolate the cells from each other. Each cell may be a square, a rectangle, a hexagon, or other shape. Each cell can be any size, depending on the desired voltage to be generated. For example, since each cell generates about 0.6 volts, for a 100 volt system about 170 cells are formed in the module. A dielectric material is then off-set printed to partially fill the gaps between cells to electrically insulate the conductive anode layer of adjacent cells.

A metallization step is then performed to create connections between the transparent cathode conductor on the top surface of a cell and the exposed anode conductor at the edge of an adjacent cell to connect all the cells in series. This metallization step can be a printed metal ink that is patterned over the dielectric material in the gaps. The cells may be connected in a serpentine pattern over the entire PV module.

A conventional PV panel is typically externally connected to a bypass diode, connected in a reverse-parallel relationship to the PV panel. The bypass diode conducts current in the event that a reverse bias voltage is applied to the PV panel, such as by an electrostatic discharge or other voltage source.

In one embodiment of the invention, each cell has a small area isolated by the laser trenching step that is used as a bypass diode for that cell. For example, depending on the size of the cell, the bypass diode may take up $\frac{1}{25}$ of the cell or less. During the metallization step, the bypass diode is connected in a reverse-parallel relationship with its adjacent PV cell to protect the cell.

The metallization step may also form thin parallel strips over the transparent conductor layer of each cell to improve the current spreading across the surface of each cell.

The metallization step may also connect some of the cells in parallel to achieve a target voltage and current for the panel.

One or more transparent layers may be formed over the silicon micro-diodes to reduce reflection. The resulting PV module is then encapsulated, such as by laminating a transparent top sheet to the panel.

Other embodiments are described in the detailed description. All steps may be performed under atmospheric pressure conditions.

BRIEF DESCRIPTION OF THE DRAWINGS

FIG. 4 also illustrates the silicon sphere layer and conductor layer being annealed to form a back surface field in the silicon spheres.

Elements that are similar or identical in the various figures are labeled with the same numeral.

DETAILED DESCRIPTION

One embodiment of the invention is a process for forming a thin PV module (or solar cell module) typically containing millions of small, substantially spherical silicon diodes electrically interconnected in series and parallel. Electricity is generated by the panel due to the photovoltaic effect. A pn junction is fabricated in lightly doped silicon, typically p-type and referred to as the base, by diffusing electron-rich or electron-deficient atoms to a depth of approximately 1 micron, typically forming a doped n-type layer referred to as the emitter. Electrical contact is made to the emitter and base on either side of the pn junction. At this junction, a depletion region forms from the presence of ionized donors and acceptors. As photons are absorbed from sunlight, free carriers are generated. These photogenerated carriers diffuse and drift to the depletion regions of the p-n junction, drift across the junction under the built-in electric field, and are collected at the electrodes, resulting in a net photocurrent. Groups of the diodes may be connected in a combination of series and parallel to create a desired operating voltage and current. The power may be used to, for example, feed into the utility grid or charge a battery.

Only photons with energies equal to or somewhat greater than the band gap of silicon (~1.1 eV) are converted to electricity by the silicon.

An atmospheric pressure printing process is described for forming an efficient PV panel. There is no need for a vacuum chamber, such as for metal depositions, dielectric depositions, etching, etc., resulting in the PV panel fabrication process being relatively simple and inexpensive to implement. This process enables a high throughput roll-to-roll manufacturing technique. Further, the process makes very efficient use of silicon.

Figure 1:
FIG. 1 is a top down view of a starting thin metal foil substrate. The substrate may be any size for a roll to roll all-atmospheric pressure printing process.

FIG. 1 is a top down view of a starting substrate 10. In the example, the substrate 10 is a flexible aluminum foil and used to conduct current. In another embodiment, the substrate 10 is any other metal, such as stainless steel, copper, brass, or other alloy. The substrate 10 may instead be a dielectric, such as a polymer sheet. The substrate 10 may be any size. Preferably, the substrate 10 is provided on a roll, and the technique described is performed as a roll-to-roll process under atmospheric pressure conditions. In the preferred embodiment, no channels are formed in the substrate 10.

Figure 2:
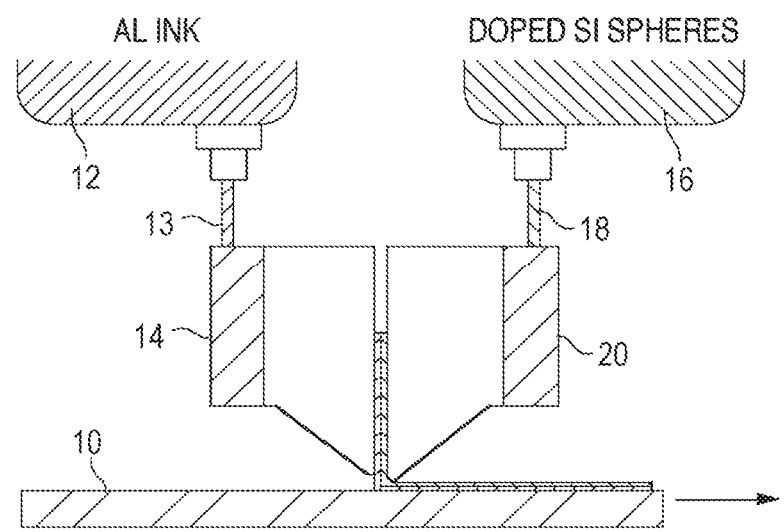
FIG. 2 illustrates an aluminum-containing ink or paste layer being slot die coated (printed) immediately prior to a layer of silicon spheres being coated, such that the spheres overlie the uncured conductor layer. These layers may be applied by other means, such as rotary screen printing or knife-over-roll coating. The printed layers are patterned to form PV cells, separated by a gap, that are ultimately connected in series.

In FIG. 2, a conductive layer is formed immediately followed by depositing a silicon sphere slurry. In another embodiment, the conductive layer can be cured prior to depositing the silicon spheres. FIG. 2 illustrates a slot die coating process, although alternative printing or coating methods (e.g., knife-over-roll coating) are envisioned. A source 12 of aluminum-containing paste or aluminum-containing ink 13 is provided to a first slot die head 14. The paste can also be a combination of aluminum and silicon or other materials. The first slot die head 14 may optionally heat the aluminum-containing ink 13, and a pump causes the ink 13 to be ejected from a long narrow slot in the first slot die head 14. Slot die heads are well known. The location and amount of the deposited aluminum-containing ink 13 is thus carefully controlled and may be used to deposit the ink only in cells areas separated by a small gap.

A source 16 of doped or intrinsic silicon spheres in a solvent system (silicon ink 18) is provided to a second slot die head 20, which also may be heated to control viscosity, and deposited onto the aluminum-containing ink 13 prior to curing of the aluminum-containing ink 13. The viscosities of the inks 13 and 18 and percentage of the particles in the solvents may be controlled to optimize spreading of the ink and the packing density of the deposited particles. The slot die heads 14 and 20 may be connected together in what is termed a dual-slot die head for precise alignment of the inks 13 and 18.

The printing of the aluminum-containing ink 13 and the silicon ink 18 may be identically patterned/controlled to form an ordered array of PV cells, where there is a small gap between each cell for electrical isolation.

In one embodiment, thousands of the doped spheres are deposited across the width of the substrate 10. The spheres are ideally packed hexagonally (i.e., each sphere has 6 spheres surrounding it in a horizontal plane) to provide the maximum number of spheres per unit area. Monolayers occur within very narrow control ranges where a small variance in print conditions favor either sparse layers or layer doubling. These difficulties are due to both the rheology of the fluid and the physical limits of either doctor blade coating or slot die coating of such highly shear thinning materials.

Moreover, by using the wet on wet approach (e.g., wet spherical laydown on a wet conductive "glue" layer), a closed packed or near perfect monolayer is made at 213 cm/min. This process has been proven with microspheres ranging in size from 10-150 microns in diameter, but a high packing density requires a total variance in diameter of at most 20 microns. The combination of both knife over roll coating and slot die coating allows a significantly enhanced coating control range and is an innovation in high speed coating of shear thinning fluids.

Figure 3:
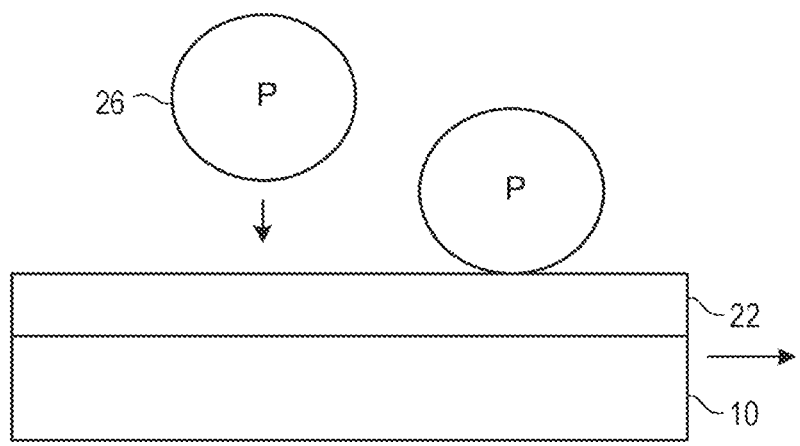
FIG. 3 is a cross-sectional view of a portion of a PV cell along a row of p-type silicon spheres, illustrating the silicon spheres being deposited on the uncured conductor layer to form a closed packed monolayer. The processes will be shown performed on only a single sphere for simplicity, although each step of the process may be simultaneously performed over the entire surface of the PV module.

FIG. 3 is a cross-sectional view of the substrate 10 across a portion of a single PV cell, showing the coating of the aluminum-containing conductor layer 22 followed by the coating of p-type silicon spheres 26. N-type, un-doped, or silicon spheres with pre-formed pn junctions may be used instead. The formation of silicon spheres is described in U.S. Pat. No. 5,556,791. In one embodiment, the spheres 26 have a mean diameter somewhere between 10-300 microns. The spheres 26 will typically not be perfect spheres so are assumed to be substantially spherical.

If screen printing is used to form the various layers described herein, the processes may be performed over a large surface of the substrate 10 while the substrate 10 is stationary. In screen printing, a fine mesh has formed on it a mask layer, such as an emulsion, that is patterned using conventional photolithographic processes. The mesh is then laid over the substrate 10. Then the liquid or paste comprising the material to be deposited is squeegeed over the mesh to force the liquid/paste through the openings in the mask to deposit the liquid/paste on the substrate 10 surface in the desired pattern. The deposited material is cured, such as by drying by heat.

Figure 4:
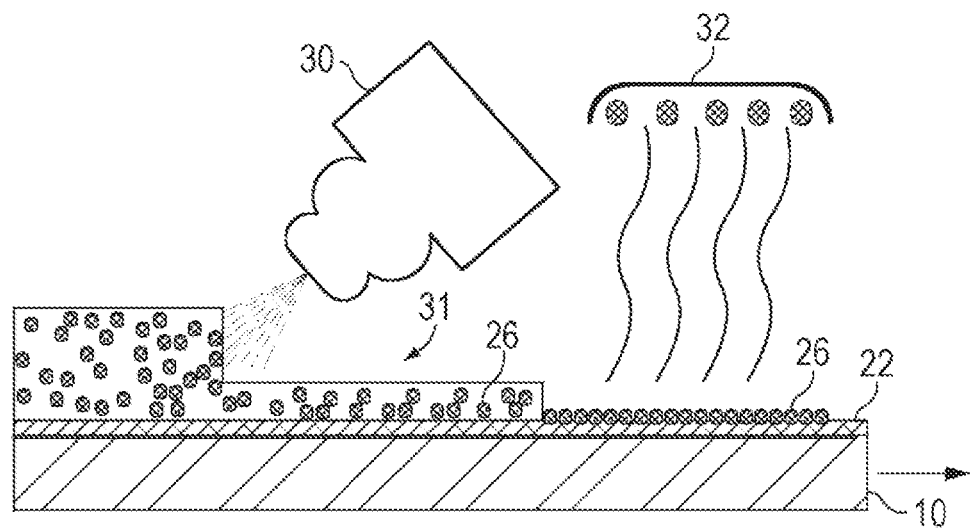
FIG. 4 illustrates an air knife evaporating the solvents from the silicon sphere slurry to aid in the formation of a thin layer, such as a monolayer, while forcing the spheres into the uncured conductor layer.

FIG. 4 illustrates an optional air knife 30 that spreads the silicon ink layer 31 to form a thin layer (e.g., a monolayer) of the spheres 26, while forcing the spheres 26 into the uncured conductor layer 22. The air knife 30, blowing heated filtered air or inert gas, also partially evaporates the ink solvent. Accordingly, there is synergy in using the air knife 30 versus a nip roller or blade. The air knife 30 may be directed normal to the substrate 10 or at an angle. In one embodiment, the air knife 30 blows a narrow-angle (a knife edge) of air. In other embodiments, any type of spreader may be used. In another embodiment, depending on the deposition technique, no spreader is needed.

FIG. 4 also illustrates the silicon ink layer 31 and conductor layer 22 being cured and annealed in a two-step process during a roll-to-roll process. The curing step evaporates the ink solvent. A heater 32 is shown. The heater 32 may be any suitable heater, including a rapid annealing system. The annealing sinters the aluminum particles in the conductive layer 22 together, forms a back surface field in the silicon (a $p^+$ region), and bonds the silicon to the conductive layer, providing both mechanical and electrical connectivity to the underlying substrate.

Figure 5:
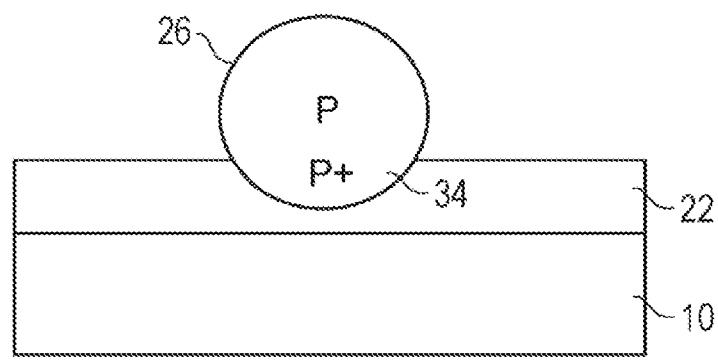
FIG. 5 illustrates the silicon spheres bonding to the conductor layer after the process of FIG. 4.

FIG. 5 illustrates the silicon spheres 26 being embedded in the cured conductive layer 22 after the process of FIG. 4 to create a large contact area. The $p^+$ area 34 forms during the Al annealing step wherever the Al is in contact with the silicon spheres 26. The Al atoms diffuse into the silicon, forming the highly doped $p^+$ area 34 and creating ohmic contact.

Figure 6:
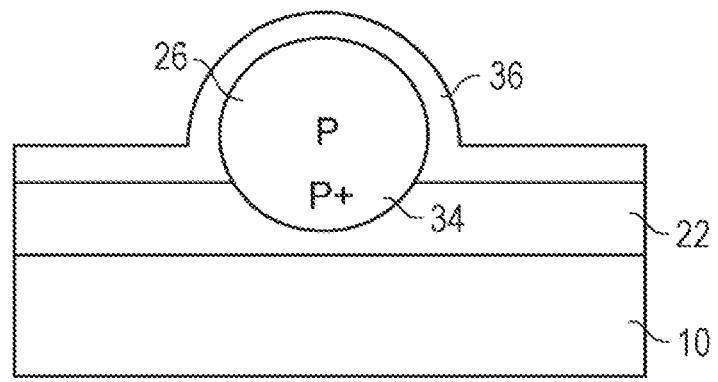
FIG. 6 illustrates a dielectric barrier layer coated over the surface of the PV panel.

In FIG. 6, a dielectric 36 is deposited over the surface of the PV panel, such as by spray coating, ink jet printing, screen printing, flexography, etc. In one embodiment, the dielectric 36 is a spray coated glass precursor, such as spin-on-glass (SOG), that is then cured. Spin-on-glass is a term used to describe a low viscosity glass that can be deposited by spin-coating or spray-coating. The thickness of the dielectric 36 is on the order of a few to a few tens of microns between the spheres since the spheres 26 only have a diameter between 10-300 microns. In another embodiment, the dielectric is a dispersion of polymer microbeads that, when cured, form a continuous insulating layer.

Figure 7:
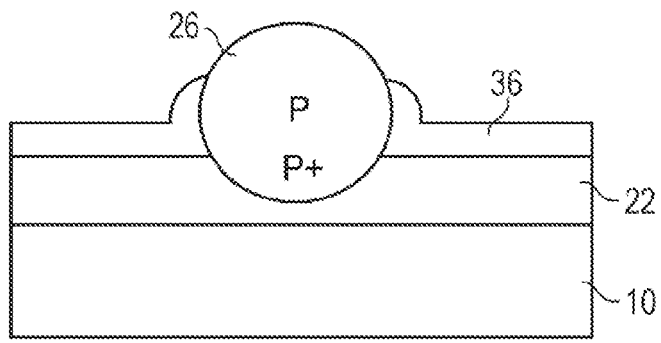
FIG. 7 illustrates the dielectric that has wetted off (or wicked off) the tops of the microspheres to expose the silicon surface.

In FIG. 7, the dielectric 36 is shown to wet off from the tops of the silicon spheres 26 to expose the upper silicon surface. Due to the low viscosity of the dielectric 36, the smooth surface of the silicon spheres, and the lack of chemical interaction between the silicon and the dielectric 36, the dielectric 36 pools along the edges of the silicon spheres 26 due to capillary action, surface tension, and gravity. This removal of the dielectric layer from the tops of the spheres may also be referred to as wicking. Even if there is a thin residual dielectric layer on the tops of the spheres 26, a subsequent laser diffusion step can overcome this thin dielectric layer to form a pn junction as described below. In another embodiment, the microbeads completely wet off the tops of the silicon microspheres exposing a pristine surface to form the PN junction.

Figure 8:
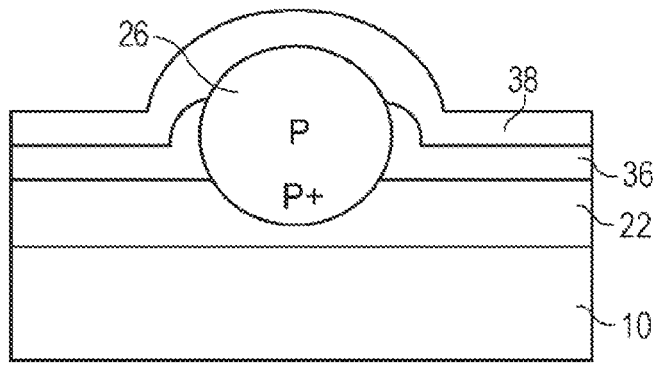
FIG. 8 illustrates an n-type dopant layer deposited over the silicon surface. N-type dopant atoms are diffused from the n-dopant layer into the silicon to create pn diodes in-situ.

In FIG. 8, an n-dopant layer 38 is deposited over the silicon surface to create pn junction diodes in-line. In one embodiment, the n-dopant layer 38 is a spray coated or printed phosphorus-doped glass layer. The dopants in layer 38 are diffused into the silicon using a pulsed laser. The laser heats the sphere surface 26 to, for instance, above the melting temperature of silicon to allow for rapid diffusion of the phosphorus into the silicon. In another embodiment, the dopant is phosphoric acid and can be coated directly over the dielectric layer, then diffused through the thin dielectric on top of the silicon microspheres using laser annealing to form p-n junctions. In a third embodiment, the dopant is phosphorus-doped nanosilicon or a phosphorus-containing silicon precursor which, upon irridation with the laser, forms a continuous silicon film. The film can either be amorphous, nanocrystalline, or monocrystalline depending on the laser conditions. When laser conditions are such to diffuse the phosphorus beyond the interface between the silicon film and the microsphere, a homojunction is formed. When the laser conditions are such to keep the phosphorus within the upper silicon layer, a heterojunction is formed. A 532 nm laser with a peak power of 45 W or less and fluences of 20-100 micro Joules, with a focal length up to 6 mm, is desirable.

All printed layers may be printed in only the areas of the PV cells, so there is a small gap between the cells.

Figure 9:
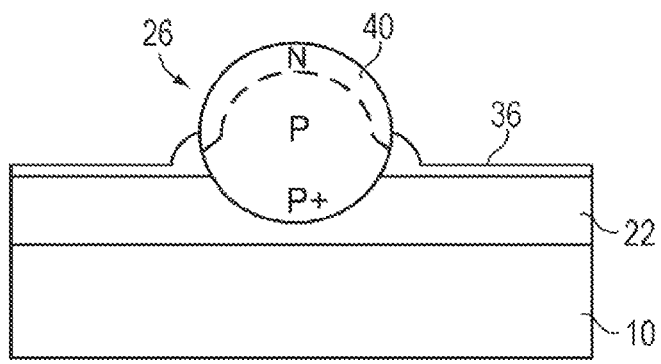
FIG. 9 illustrates the n-type dopant layer being washed off after doping the underlying silicon.

In FIG. 9, the remainder of the n-dopant layer 38 is washed or etched away, which may also further thin the dielectric layer 36. FIG. 9 illustrates the top portion of the silicon spheres 26 being an n-type portion 40, thus a pn diode is formed in-line using a roll-to-roll process. An additional dielectric layer may be deposited, if needed, that is designed to wet from most of the sphere surface so as to pool around the perimeter of the smooth spheres by gravity, surface tension, and capillary action.

Figure 10:
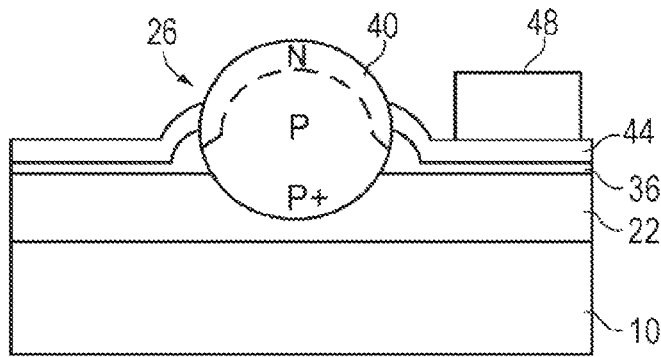
FIG. 10 illustrates a transparent conductor or other conductor coated at least along the edges of the silicon spheres. The transparent conductor material, if deposited as a liquid, may automatically retract from the top surfaces of the spheres by capillary action and desirably pool around the perimeter of the spheres to form a conducting network.

In FIG. 10, a transparent conductor or other conductor layer 44 is deposited at least along the edges of the silicon spheres 26 to electrically contact the n$^+$-type portion 40 of the spheres 26, and annealed to lower the contact resistance. In one embodiment, the conductor layer 44 is deposited by slot die coating, entailing forcing the liquid conductor material through a narrow slot onto the surface. In one embodiment, the transparent conductor material has a sufficiently low viscosity so as to pool around the perimeter of the smooth spheres by gravity, surface tension, and capillary action. The pooling of the transparent conductor lowers the resistance of the conductor and improves reliability. Since the transparent conductor substantially wicks off the tops of the diodes, any reflection problems with the transparent conductor are avoided, and any mismatch of index of refraction between the transparent conductor and the silicon becomes irrelevant. If desired, any thin conductor layer may be etched off the tops of the spheres using a wet etch.

If a non-transparent conductor layer is used, any conductor material over the top of the spheres 26 that significantly attenuates light in the solar radiation spectrum that can be absorbed by silicon should be etched away. In one embodiment, a layer comprising nanometer sized silver particles or wires in a binder is used as the conductor layer 44. The silver particles or wires contact each other after curing. In one embodiment, the conductor layer 44 is about 100-200 nm thick after drying.

All the micro-diodes in each individual cell are now connected in parallel, with the metal foil substrate 10 providing a continuous conductor under all the cells.

A low resistivity metal bus bar 48 is shown that is ultimately printed over the transparent conductor layer 44 in a metallization step, such as by inkjet printing or rotary screen printing of silver or other conductor, to better spread current over the transparent conductor surface.

Figure 11:
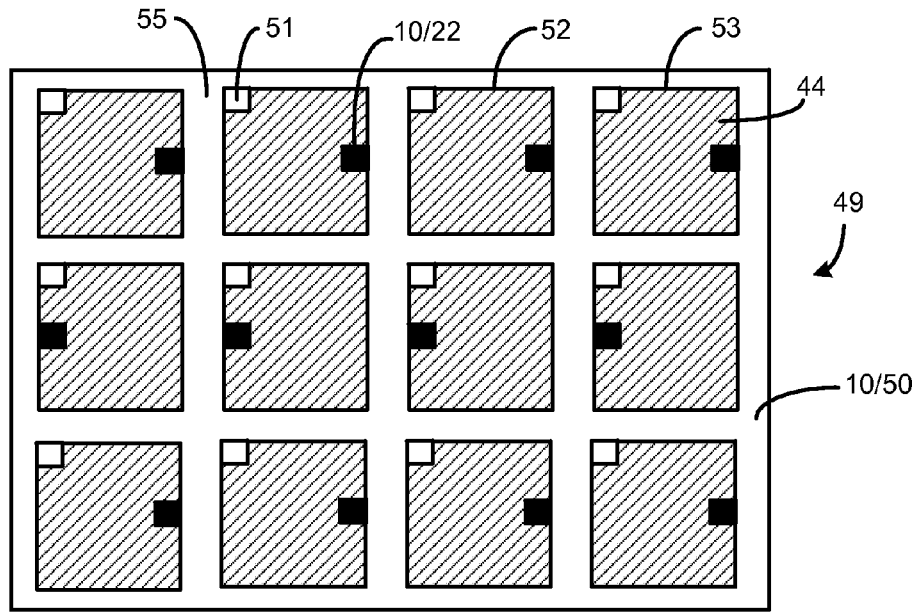
FIG. 11 is a top down view of the resulting PV panel, showing gaps between the cells, after the metal foil substrate is laminated to a dielectric substrate, such as in a roll-to-roll process.

FIG. 11 is a top down view of the resulting PV module 49. In FIG. 11, a dielectric substrate 50 is laminated to the bottom surface of the metal foil substrate 10, preferably in a roll-to-roll process. The substrate 50 may be a thin film of polycarbonate, PET, or other polymer or polymer composite, and can serve as the PV module backsheet. The transparent top conductor layer 44 in each cell is also shown.

Also shown are areas (solid black) in each cell (e.g., cells 52 and 53) where the aluminum conductor layer 22 is exposed by the selective printing of the overlying layers. Alternately, only the metal foil substrate 10 is exposed in the solid black areas.

Also shown are bypass diodes 51, which are isolated areas at the corners of each cell, formed by patterning the printed layers.

The gaps 55 between the cells are identified.

Figure 12:
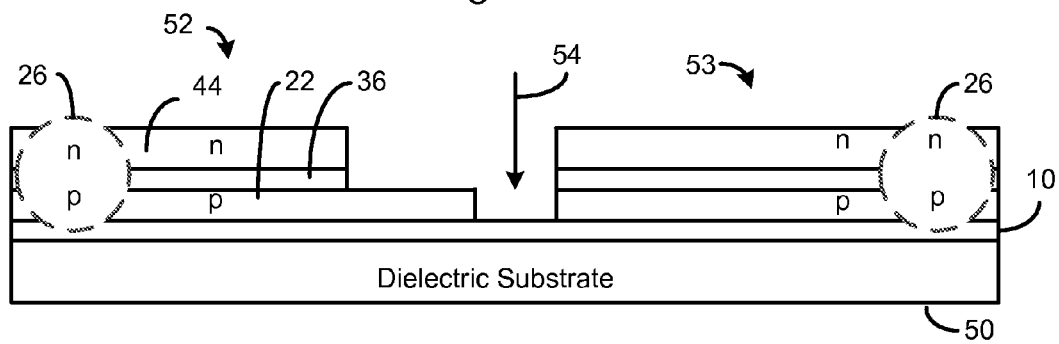
FIG. 12 is a cross-sectional view of an edge of two cells, where a laser ablates the metal foil substrate around each cell to electrically isolate each PV cell.

FIG. 12 is a cross-sectional view of the edges of two adjacent PV cells 52 and 53 from FIG. 11. Note that the cells have a common conductive substrate 10 that needs to be severed in order to electrically isolate each cell. A $CO_2$ laser 54 is controlled to form narrow trenches in the substrate 10 around each PV cell (e.g., cells 52 and 53), by ablation, down to the dielectric substrate 50 to electrically isolate each PV cell.

The number of cells depends on the desired voltage for the PV panel, where each cell generates about 0.6 volts, and the cells are to be connected in series. PV panels generating in excess of 300 volts may be formed using the present process. Each cell may be, for example, one square inch, or any other size. For the materials used in the present invention, laser ablation is used instead of mechanical scribing with a sharp tool, since a laser will create a more defined cell trench with no tearing or stretching of the layers. A laser may also be more accurately controlled. Further, laser ablation is a non-contact method so enables the process to be done in-line during the roll-to-roll PV module fabrication process.

As an alternative to the embodiment of FIG. 12, the spheres 26 and layers 22, 36, and 44 are patterned in the exact same way to have aligned edges, and the laser ablation is controlled to retain a portion of the metal foil substrate 10 extending from an edge of each cell for electrical contact by the subsequent metallization step.

Figure 13:
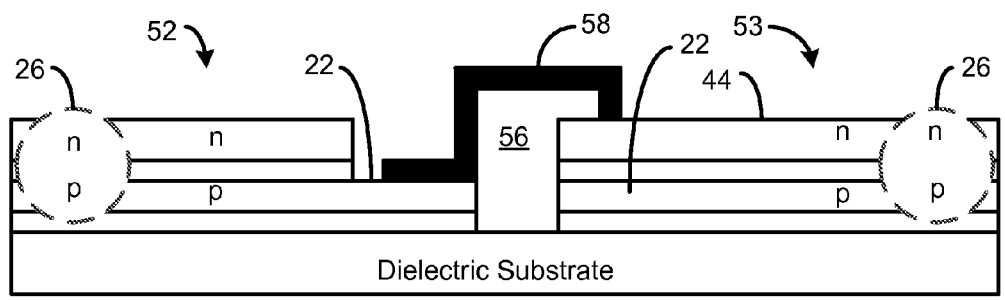
FIG. 13 illustrates a conductor connecting two adjacent PV cells in series.

As shown in FIG. 13, a dielectric 56 is then printed in the trench/gap areas to insulate the anode conductor 22 of the cell 53.

A metallization step is then performed, such as by printing and curing, to form conductors 58 electrically connecting the cathode conductor layer 44 of one cell 53 to the anode conductor layer 22 (or metal foil substrate 10) of the adjacent cell 52 to connect the cells in series.

Figure 14:
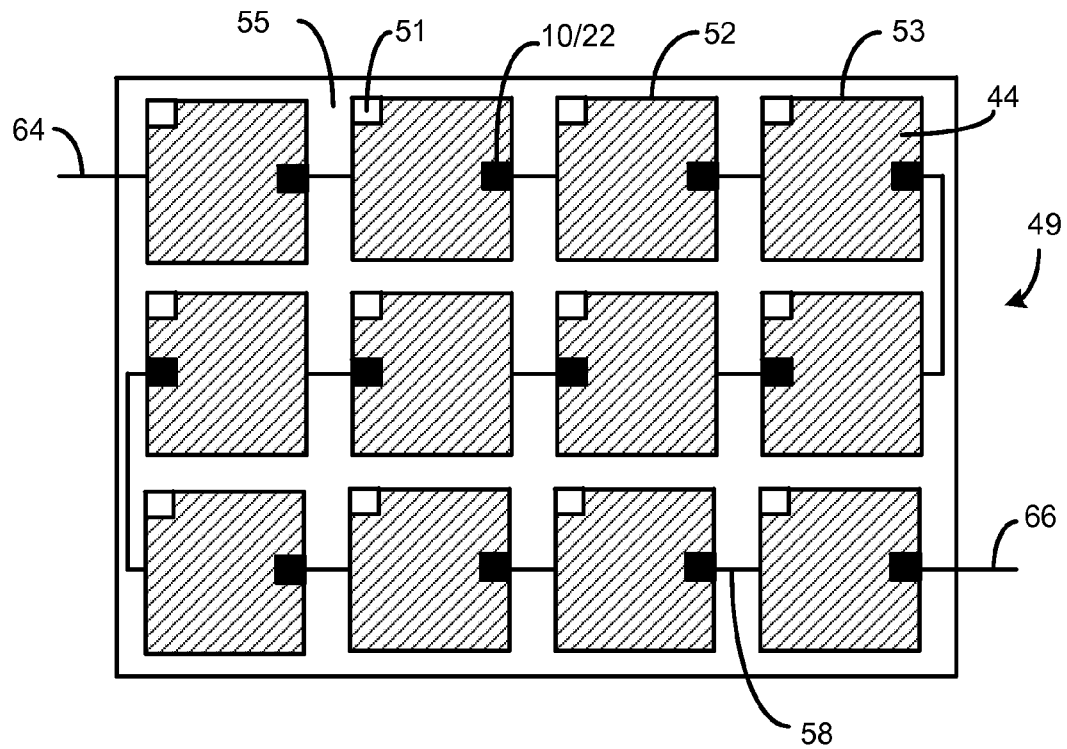
FIG. 14 is a top down view of a PV panel containing 12 cells connected in series. Each cell also contains a bypass diode.

FIG. 14 is a top down view of the PV panel 49 containing 12 cells connected in series by the conductors 58. A serpentine path of the series-connected cells is shown. The solid black areas represent the exposed anode conductor layer 22 or metal foil substrate 10, and the cross-hatched layer represents the cathode conductor layer 44. In the example of 12 cells connected in series, the output voltage is about 7.2 volts. Many more cells can be connected in series to raise the voltage to any desired level. Each cell may contain many thousands of the micro-diodes connected in parallel.

Each cell also contains a bypass diode 51.

Figure 15:
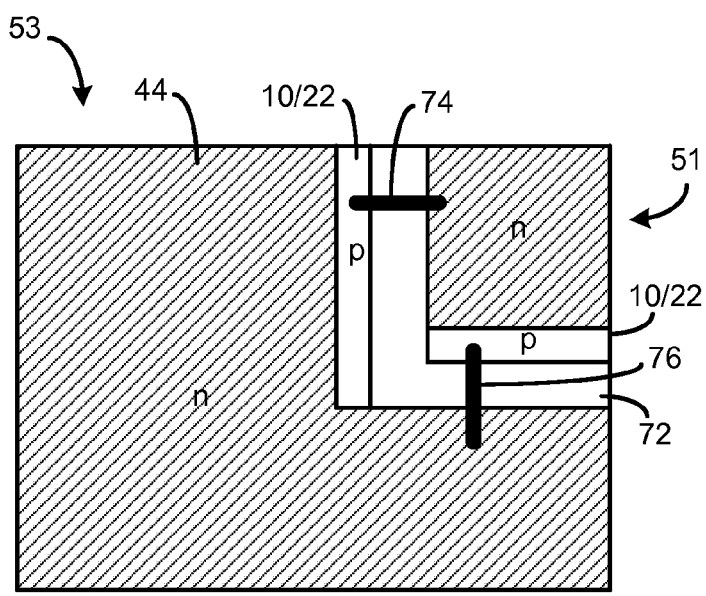
FIG. 15 is a top down view of a small portion of a cell illustrating the bypass diode connected in a reverse-parallel relationship to the cell.

FIG. 15 is a top down view of a small portion of a cell 53 illustrating the bypass diode 51 connected in a reverse-parallel relationship to the remainder of the cell 53. Trenches 72 are laser ablated around the bypass diode 51, along with the trenches (FIG. 12) around the cells, to electrically isolate the bypass diodes 51. During the metallization step, the conductors 74 and 76 are printed to connect the bypass diodes 51 in a reverse-parallel relationship with the associated cell to conduct current in the event of a sufficiently high reverse bias voltage across the cell or the PV module.

An antireflective coating may be provided over the panel. A protective transparent sheet may be laminated or printed/sprayed over the panel.

If desired, an additional section of the PV module may be isolated by trenches/gaps and connected in series with the PV module to form a blocking diode.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A process for forming a solar cell structure comprising:
depositing a first conductor layer on a metal substrate;
providing a plurality of diode spheres on the first conductor layer as a first diode layer, the diode spheres having a top surface portion of a first conductivity type, for being exposed to the sun to generate electricity, and having a bottom surface portion of a second conductivity type electrically contacting the first conductor layer;
depositing a second conductor layer electrically contacting the top surface portion,
wherein at least the diode layer and the second conductor layer are patterned to form an array of cells, wherein there is a gap between adjacent cells;
providing a dielectric substrate affixed to a bottom surface of the metal substrate;
laser ablating first trenches through at least the metal substrate to form a plurality of electrically isolated cells; and
interconnecting at least some of the cells in series by electrically connecting the first conductor layer of one cell to the second conductor layer of an adjacent cell.

2. The process of claim 1 further comprising forming a bypass diode associated with each cell by forming second trenches through at least the metal substrate within each cell and interconnecting the bypass diode and its associated cell in a reverse-parallel relationship.

3. The process of claim 1 wherein the step of providing the diode spheres comprises printing semiconductor spheres in an ink on the first conductor layer and then curing the ink.

4. The process of claim 1 wherein the step of laser ablating comprises forming the first trenches only through the metal substrate down to the dielectric substrate.

5. The process of claim 1 wherein the first conductor layer is patterned when deposited to correspond to the array of cells.

6. The process of claim 1 wherein an edge of the metal substrate extends out from each of the cells after the step of laser ablating to gain electrical access to the bottom surface portion of the diodes.

7. The process of claim 1 wherein the second conductor layer comprises a transparent conductor material.

8. The process of claim 1 wherein the step of interconnecting comprises printing a patterned metal layer to interconnect the cells in series.

9. The process of claim 1 where the step of providing the diode spheres comprises depositing semiconductor spheres on the first conductor layer and then doping the semiconductor spheres to create a pn junction in each of the semiconductor spheres to create the diode spheres.

10. The process of claim 1 wherein all steps are performed at atmospheric pressures.

11. The process of claim 1 wherein the process is a roll-to-roll process.

12. The process of claim 1 wherein the diode spheres comprise microscopic silicon spheres.

13. The process of claim 1 wherein the cells are connected in series in a serpentine pattern.

14. The process of claim 1 wherein the diode spheres comprise microscopic diode spheres, wherein each of the cells comprises a subset of the plurality of diode spheres connected in parallel.

* * * * *